United States Patent [19]

Beausoleil et al.

[11] 3,990,045

[45] Nov. 2, 1976

[54] ARRAY LOGIC FABRICATION FOR USE IN PATTERN RECOGNITION EQUIPMENTS AND THE LIKE

[75] Inventors: William Francis Beausoleil, Hopewell Junction; Richard Hiller, Endwell, both of N.Y.

[73] Assignee: International Business Machines Corporation, Armonk, N.Y.

[22] Filed: June 24, 1974

[21] Appl. No.: 482,824

[52] U.S. Cl. .................. 340/146.3 MA; 307/203; 307/207; 307/213; 340/146.3 T
[51] Int. Cl.² .................. G06K 9/06; H03K 19/08
[58] Field of Search .......... 307/203, 207, 209, 303, 307/208, 213, 221 R; 235/152, 92 DP, 92 LG; 340/146.3 MA 172.5, 146.3; 328/92

[56] References Cited
UNITED STATES PATENTS

| | | | |
|---|---|---|---|
| 3,454,310 | 7/1969 | Wilhelm, Jr. | 307/203 |
| 3,619,583 | 11/1971 | Arnold | 307/203 |
| 3,643,232 | 2/1972 | Kilby | 307/213 |
| 3,818,252 | 6/1974 | Chiba et al. | 307/207 |
| 3,849,638 | 11/1974 | Greer | 307/207 |
| 3,905,018 | 9/1975 | Gray | 340/146.3 MA |

Primary Examiner—Leo H. Boudreau
Attorney, Agent, or Firm—Bernard M. Goldman

[57] ABSTRACT

A fabrication arrangement using plural LSI chips to make a bit stream detection system requiring a programmable logic array which is too large to fit on a single LSI chip. Due to the small number of input/output pins available on any LSI chip, the fabrication arrangement divides among the chips an input shift register, the array, and array input latches. Each LSI chip also has time-multiplexed array outputs and time-multiplexed feedback inputs that minimize the pins and enable interconnection among the array section outputs on the chips so that they combine into the single large array required by the detection system. These LSI chips can be identically fabricated.

7 Claims, 22 Drawing Figures

FIG. 1
FIG. 2A
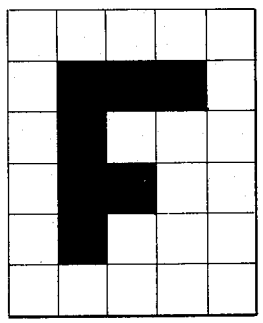
FIG. 2B
| 30 | 24 | 18 | 12 | 6 |
|----|----|----|----|---|
| 29 | 23 | 17 | 11 | 5 |
| 28 | 22 | 16 | 10 | 4 |
| 27 | 21 | 15 | 9  | 3 |
| 26 | 20 | 14 | 8  | 2 |
| 25 | 19 | 13 | 7  | 1 |
FIG. 3
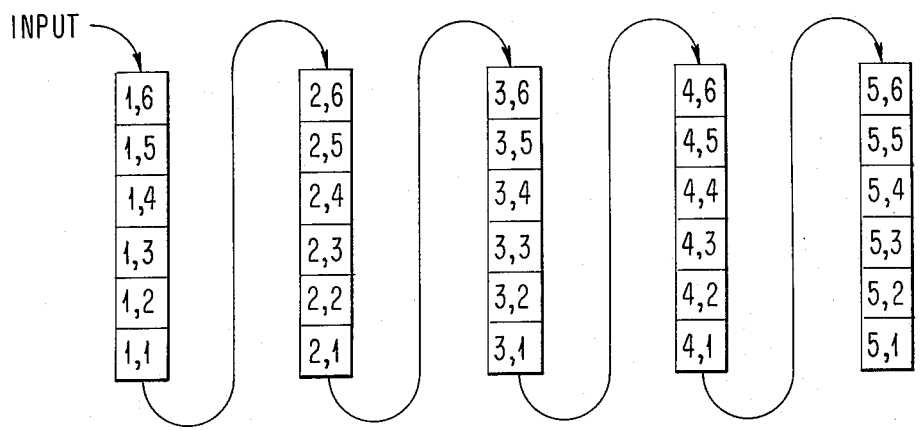

| 1 | 7 | 13 | 19 | 25 |
|---|---|---|---|---|
|  |  |  |  |  |
| 2 | 8 | 14 | 20 | 26 |
|  |  |  |  |  |
| 3 | 9 | 15 | 21 | 27 |
|  |  |  |  |  |
| 4 | 10 | 16 | 22 | 28 |
|  |  |  |  |  |
| 5 | 11 | 17 | 23 | 29 |
|  |  |  |  |  |
| 6 | 12 | 18 | 24 | 30 |
|  |  |  |  |  |

| 1,6 | 2,6 | 3,6 | 4,6 | 5,6 |
|-----|-----|-----|-----|-----|
| 1,5 | 2,5 | 3,5 | 4,5 | 5,5 |
| 1,4 | 2,4 | 3,4 | 4,4 | 5,5 |
| 1,3 | 2,3 | 3,3 | 4,3 | 5,3 |
| 1,2 | 2,2 | 3,2 | 4,2 | 5,2 |
| 1,1 | 2,1 | 3,1 | 4,1 | 5,1 |

| 0 | 0 | 0 | 0 | 0 |
|---|---|---|---|---|
|   |   | 1 | 1 | 0 |
|   |   | 0 | 0 | 0 |
|   |   |   |   | 0 |
|   |   |   |   | 0 |
|   |   |   |   | 0 |

OR 100 = (2,3) V (2,4) V (2,5) V (2,6)
OR 101 = (3,3) V (3,4) V (3,5) V (3,6)
OR 102 = (4,3) V (4,4) V (4,5) V (4,6)
OR 103 = (5,4) V (5,5) V (5,6) V (5,7)
OR 104 = (6,4) V (6,5) V (6,6) V (6,7)
OR 105 = (7,4) V (7,5) V (7,6) V (7,7)
OR 106 = (8,4) V (8,5) V (8,6) V (8,7)

ARRAY LOGIC FABRICATION FOR USE IN PATTERN RECOGNITION EQUIPMENTS AND THE LIKE This invention relates to data processing and more particularly to systems and circuits providing programmable array logic and data shift registers in the performance of logical operations such as in the feature extraction component of pattern recognition devices. This patent application is a companion to application Ser. No. 482,816 filed on the same day as this application and owned by the same assignee.

BACKGROUND OF THE INVENTION

In pattern or character recognition devices one approach is to assume that the object to be recognized belongs to a finite collection of patterns and also to assume that the object may be addressed by recognition devices on the basis that at no time will a given size field of view contain more than one pattern or character. This approach has been most successfully used in recognizing textual information such as printed alphanumeric data. The more regular the printed matter, that is, the more stylized or regimented the character, the more successful the recognition device becomes in correctly identifying the character.

The development of character recognition devices has been toward an ideal device which could recognize a character with a relatively wide variation from the stylized form. Such a device would be capable of recognizing unconstrained hand printing and perhaps even handwriting. An important advance toward the attainment of the ideal is the incorporation of feature extraction in the recognition process. In feature extraction, the character under test is subjected to a large number of feature measurements to find the properties of the character, and if a sufficient number of properties exist belonging to a specific character value, then a probabilistic determination can be made that the character under test is recognized as a particular type. For example, a three and five each have a lower left tip. This property is invariant over a large number of type fonts. Consequently, a recognition of such a feature would identify the character as suitable for identification as one of those numbers. Further feature measurements can narrow the possibilities until a definite recognition is made.

The process, however, is complicated by many factors including the fact that characters may be produced by devices using different type fonts. It is complicated by the fact that characters produced by devices using the same type font may differ because of different printing pressure, age of the ribbon, wear of the print element or dirt on the print element. There may be a great deal of noise accompanying the character in the form of dirt or extraneous lines, and unconstrained hand print introduces not only wide character variation but also ball point pens that skip and graphite and ink that smear. Consequently, the design of a complete set of feature enabling correct recognition in a high percentage of cases is an ongoing task through the life of a particular recognition device. As experience is gained with a recognition system, feature measurements are changed and added or subtracted to improve the percentage of correct identifications. Therefore, the improvement of feature extraction is an area of high engineering change activity, and it is a general object of this invention is to provide a system in which feature measurements may be easily modified during both the design phase and the field life of the recognition device.

To provide a feature recognition system and device with the requisite changeability it is clear that the customary hard-wired logic circuits are difficult to change and therefore prohibitively expensive when change is necessary. Since hard-wired logic has been the usual approach in the past, character recognition devices have fallen far short of the ideal. Software approaches to implementing recognition logic have been devised and theoretically could be utilized for feature measurements in recognizing unconstrained character sets; however, due to the large number of measurements which must be made, the speed of recognition has been unsatisfactory and the process too expensive in the use of computer time. Thus while software is appropriately changeable it is inappropriately expensive and too slow. Therefore, it is another general object of this invention to provide sophisticated recognition equipment which is high speed as well as changeable.

In the implementation of the system of this invention, it is also necessary to produce the recognition function at a sufficiently low cost to produce a viable product. To that end it is another general object of this invention to design a system capable of utilizing devices which employ large scale integrated circuitry (LSI) in the feature recognition system.

SUMMARY OF THE INVENTION

To attain the foregoing general objects a programmable logic array has for the first time been provided for use in the feature extraction component of a character recognition device. Such a device, since it is hard-wired, provides high speed, and since it is programmable it affords changeability. Such a device is also capable of handling a broad range of inputs. To provide the input to the programmable logic array, the array is combined with a data shift register into which the character to be recognized is placed. Also, since feature extraction may involve multiple levels of logic, feedback registers are provided to enable the attainment of as many levels of logic as desired.

The combination of shift registers and feedback registers with array logic is important in the production of a device which is low in cost since the use of LSI technolgy is important in the attainment of that end. Since both shift registers and programmable logic arrays are extremely regular in circuit format, an LSI chip made of these components is readily designable and easier to produce with fewer rejects.

In LSI technology thousands of circuits are provided in an extremely small area of a silicon chip. Consequently, the number of input and output pins are limited by space considerations and it is necessary to minimize the number of pins from which information is to be implanted in the chip circuits or extracted therefrom. A feature of the invention, as exampled herein, is the multiplexing of 48 logic outputs onto twelve output pins enabling the design of an LSI chip which contains a great deal more logic in the silicon. This feature not only provides for the packing of logic on a chip, it necessarily means that fewer chips are needed to implement the entire system. The number of pins for input is minimized by the use of a data shift register.

Since the physical size of the logic array is primarily determined by the number of input lines to each logic circuit from the data shift register, it is impossible to produce an LSI chip with very many logic circuits if the number of inputs is large. To solve this problem, the number of input lines to each logic circuit has been reduced by placing only a portion of the input data shift register onto each chip. To provide the total system, a feature of the invention is to tie corresponding chip output lines together in a dot OR interconnection.

To restate by example, the system of the invention is the use of shift registers in the provision of data input to an associative memory array, that is, to a programmable logic array. Feedback registers are connected to store intermediate logic array results and thus enable multiple levels of logic performance from the array. The outputs of the array are multiplexed to minimize bus size in providing feedback, in minimizing the number of output pins and in maximizing the use of silicon in an LSI circuit implementation of the system. In a particular system design, 960 digital inputs are fed into n programmable AND circuits, 48 in the example, and the resultant 48 outputs are multiplexed in 12 groups of four at four different phase times onto 12 output pins. The provision of four phase times per data shift cycle enables the provision of four logic operations per data shift cycle as well as enabling the multiplexing of outputs to a minimal number of output pins. Each LSI chip is large enough to contain a q-position portion of the inputs, 60 in the example, thus necessitating 16 chips to accommodate all 960 inputs. The 12 outputs of each chip are dot OR connected to provide the 960 × 48 array. The array size is actually 1024 × 48 because provision is made for 64 feedback latches, four per chip, 48 for the 48 logic circuit outputs and r number of extra latches, 16 in the example, for implanting various external information into the array, if desired.

BRIEF DESCRIPTION OF THE DRAWINGS

The foregoing and other objects, features and advantages of the invention will be apparent from the following detailed description of a preferred embodiment of the invention as illustrated in the accompanying drawings wherein:

FIG. 1 is a block diagram of a character recognition device.

FIG. 2, comprised of FIGS. 2A and 2B, shows a 30 position scan area with the character "F" and the order of scanning.

FIG. 3 is a depiction of the 30 position shift register into which the data of the scan is entered.

ADDITIONAL BACKGROUND

Figure 4:
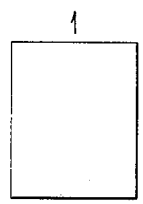
FIG. 4 is a depiction of the letter "F" as it is shifted through the 30 position shift register.
Figure 4:
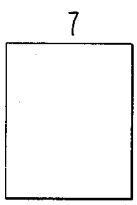
Figure 4:
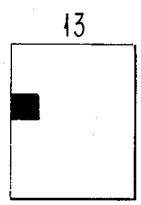
Figure 4:
Figure 4:
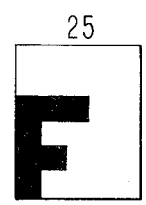
Figure 4:
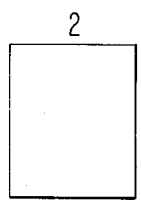
Figure 4:
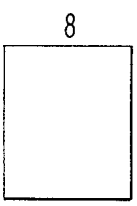
Figure 4:
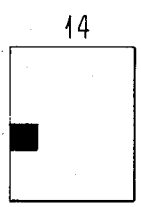
Figure 4:
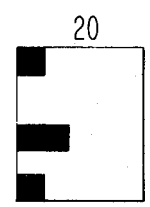
Figure 4:
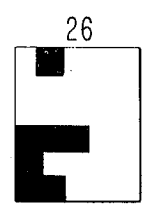
Figure 4:
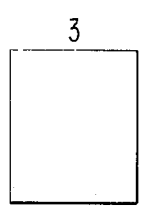
Figure 4:
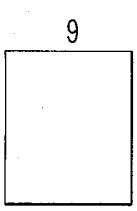
Figure 4:
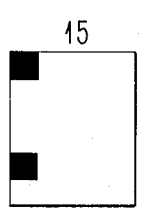
Figure 4:
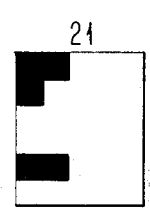
Figure 4:
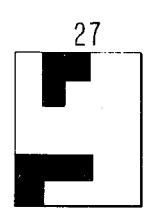
Figure 4:
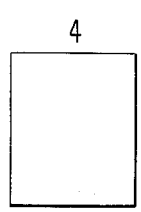
Figure 4:
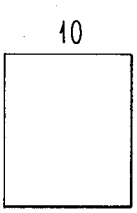
Figure 4:
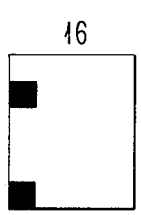
Figure 4:
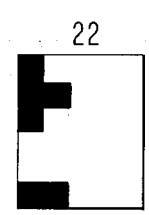
Figure 4:
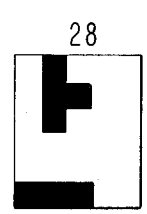
Figure 4:
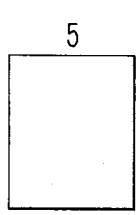
Figure 4:
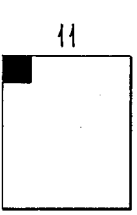
Figure 4:
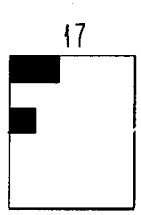
Figure 4:
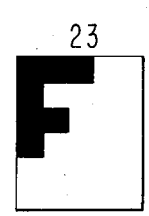
Figure 4:
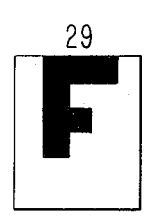
Figure 4:
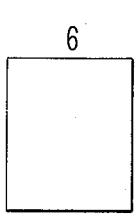
Figure 4:
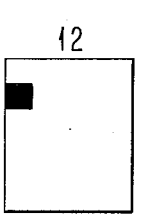
Figure 4:
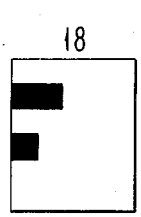
Figure 4:
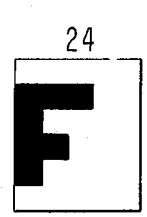
Figure 4:
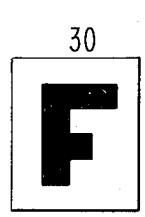

Since the system of the invention provides for the incorporation of shift registers with programmable arrays and since the invention is exampled with respect to use in a feature extraction component of a character recognition device, it is necessary to understand the functioning of a shift register in character recognition as well as the functioning of the logic array.

In order to understand the functioning of a shift register in a character recognition device reference will be made to FIGS. 2A through 7. FIG. 2A shows a primary scanning area divided into 30 sub-areas. The primary area is shown to contain the letter F. In a digital representation of the information shown in FIG. 2A each sub-area represents a digit in the memory element. Each of these sub-areas or digits may be provided with a number indicating the scanning order i.e. the order in which each of these digits or sub-areas is inspected to determine the presence of black or white, i.e., a zero state or one state condition. FIG. 2B shows the primary scanning area with the numerical sequence of the examination of each sub-area. FIG. 3 provides the depiction of a 30 position shift register into which the digits scanned in FIG. 2 are put and shifted. Thus, for example, the digital information in scanning area 1 would be shifted into the upper left location of the shift register (Cartesian coordinate 1,6) in FIG. 3 on the first cycle. Subsequently, after 30 shift cycles, the digital information in sub-area 1 would appear in the lower right hand corner of the shift register at Cartesian coordinate (5,1). It should be noted that the numerical designations in each area of the shift register shown in FIG. 3 are designations of Cartesian coordinates and they are not related to the scanning order locations in FIG. 2B.

If the shift register shown in FIG. 3 is utilized in the character recognition process it is apparent that after 30 cycles the shift register will contain the character F in the same orientation that it is shown in FIG. 2A. Ordinarily, however, the feature extraction measurements are not made just at or after the thirtieth cycle but are made continually through all 30 cycles so that the effect is to roll the character around through the shift register and view it in different orientations in order that any variation from a normalized character F will not destroy the capability of a recognition machine in recognizing the character which it contains. It is also customary to provide a so-called "white pump" to roll the character beyond the thirtieth cycle for a few more cycles in order to continue the feature extraction process beyond the normalized location. The reason for continuous testing is shown, for example, if the upper right line of the character F had extended further to the right than the normalized character in FIG. 2A. Thus, if the only measurement testing to identify an upper right tip was at the thirtieth cycle, the machine would find the line running out of the scanning area resulting in the feature being unrecognizeable. Similarly, if the machine is checking for a left-hand tip it might be necessary to shift the letter a few more cycles (the white pump) before the presence of an extra-long tip could be successfully detected.

FIG. 4 shows the position of the letter F as it is shifted through the shift register for the first 30 cycles. A comparison of FIGS. 2A and 2B show that the first appearance of the letter F is in the sub-area scanned in the eleventh scan. FIG. 4 illustrates the condition of the shift register when the black portion of the letter F makes its first appearance on the eleventh cycle. Subsequent cycles shown in FIG. 4 illustrate the rolling of the character F through the register.

Figures 5A, 5B, 5C:
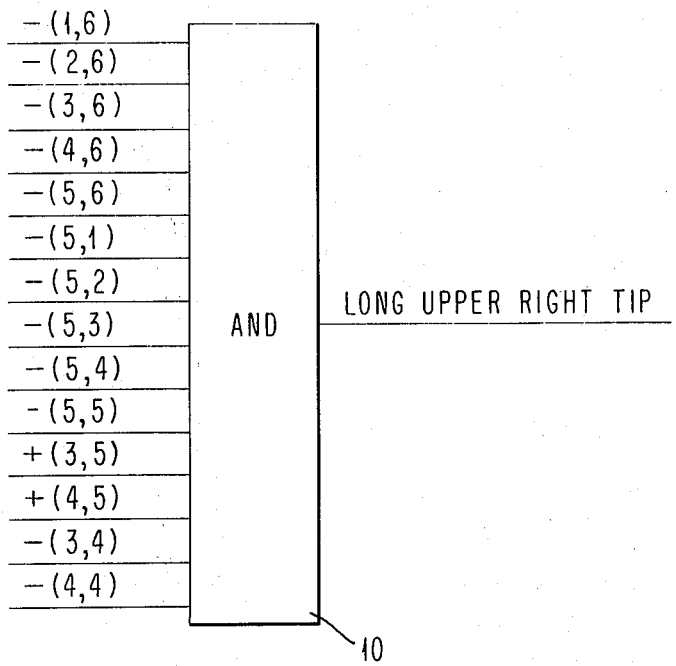
FIG. 5A shows the Cartesian coordinates for the 30 positions in the scan area.
FIG. 5B illustrates digital criteria for feature recognition where the feature is a long upper right tip.
FIG. 5C illustrates a logic circuit representation for implementing the criteria of FIG. 5B.

In FIG. 5A a Cartesian coordinate notation is provided for the 30 position scanned area. FIG. 5B provides a digital definition of the criteria for a long upper right tip feature i.e. the machine is wired to recognize a long upper right tip when all of the digits in column 5 are zeros, all of the digits along the top are zeros, Cartesian coordinates (3,4) and (4,4) are zeros and Cartesian coordinates (3,5) and (4,5) are ones. If the test for that condition is made successfully, the character will be considered to contain a long upper right tip. The pictorial representation of the criteria for a long upper right tip shown in FIG. 5B can also be expressed in a logic circuit representation as shown in FIG. 5C. In FIG. 5C each of the input lines to the AND circuit 10 represents the state of the Cartesian coordinates necessary for satisfying the criteria for a long upper right tip. The minus sign indicates that the satisfying input for that sub-area is the zero state while the plus sign indicates the satisfying criteria for that sub-area is the one state. If all of the inputs to the AND circuit 10 meet the criteria, an output is produced which indicates a long upper right tip.

As previously mentioned the test for any particular feature occurs at each of the 30 cycles and perhaps a few additional cycles called the white pump as well. Therefore, if the inputs shown on FIG. 5C are produced at any one of those cycles the long upper right tip will have been found and the feature presence indicated. Additionally it should be noted that while the AND circuit 10 of FIG. 5C has 14 inputs the total scan area has 30 digits. Thus the AND circuit to completely test the area has 30 inputs. Since only 14 inputs are essential for the identification of a long upper right tip, the remaining 16 inputs not shown in FIG. 5C would be in a "don't care" condition.

The criteria for the test shown in FIG. 5B is termed a tight measurement since the criteria would be satisfied only in cycle 30 in the example shown. If a looser criteria had been set for finding the long upper right tip such as, for example, if the coordinate (3,5) is tested for the one state but the coordinate (4,5) is tested for a "don't care" condition, then the criteria would have been satisfied on several different cycles during the spiraling of the F through the shift register. For example, the criteria might be satisfied by the long upper right tip and it might also be satisfied by the lower bar on the F at certain positions in the shifting cycle.

Figure 6:
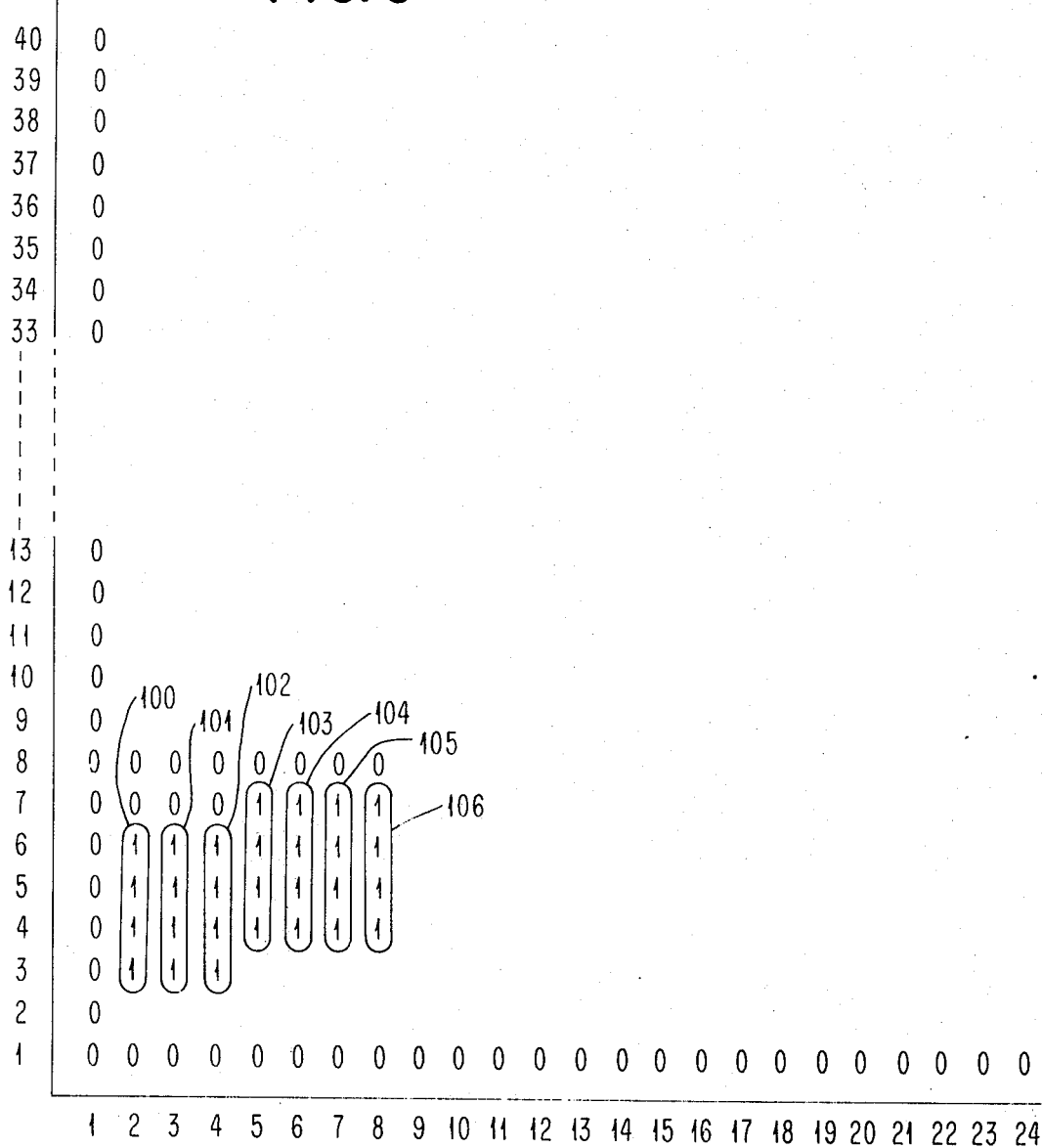
FIG. 6 illustrates criteria for feature recognition where the feature is a lower left tip.

FIG. 6 shows a much larger array, 40 × 24, instead of the simple 30 position array shown in the previous Figures. The particular one state and zero state conditions shown in FIG. 6 are those positions in the array which must take those values in order to satisfy a feature criteria for a long lower left tip. The spread of the four one state digits along the vertical positions show that the test is for a line which could occupy a spread of values along the vertical. The grouping 100 to 106 around each column of one value digits are AND'ed with each other. Thus to detect a line extending to a lower left tip the line could pass through several levels of depth but it would have to pass through all of the columns represented by one value digits in the grouping 100–106.

To restate the test, the criteria is that the line must pass through seven designated columns and must pass through any of the designated one state digits in a particular column, hence each of these one state digits are OR'ed together and the result of each of these seven ORs is ANDed together. A Boolean representation of the Cartesian coordinates for the seven OR's is also shown on FIG. 6. In addition, column one shows a 40 zero digit registration and line one shows a 24 zero digit registration; lines seven and eight also show a zero digit registration which must be satisfied for identifying this particular feature.

Figure 7:
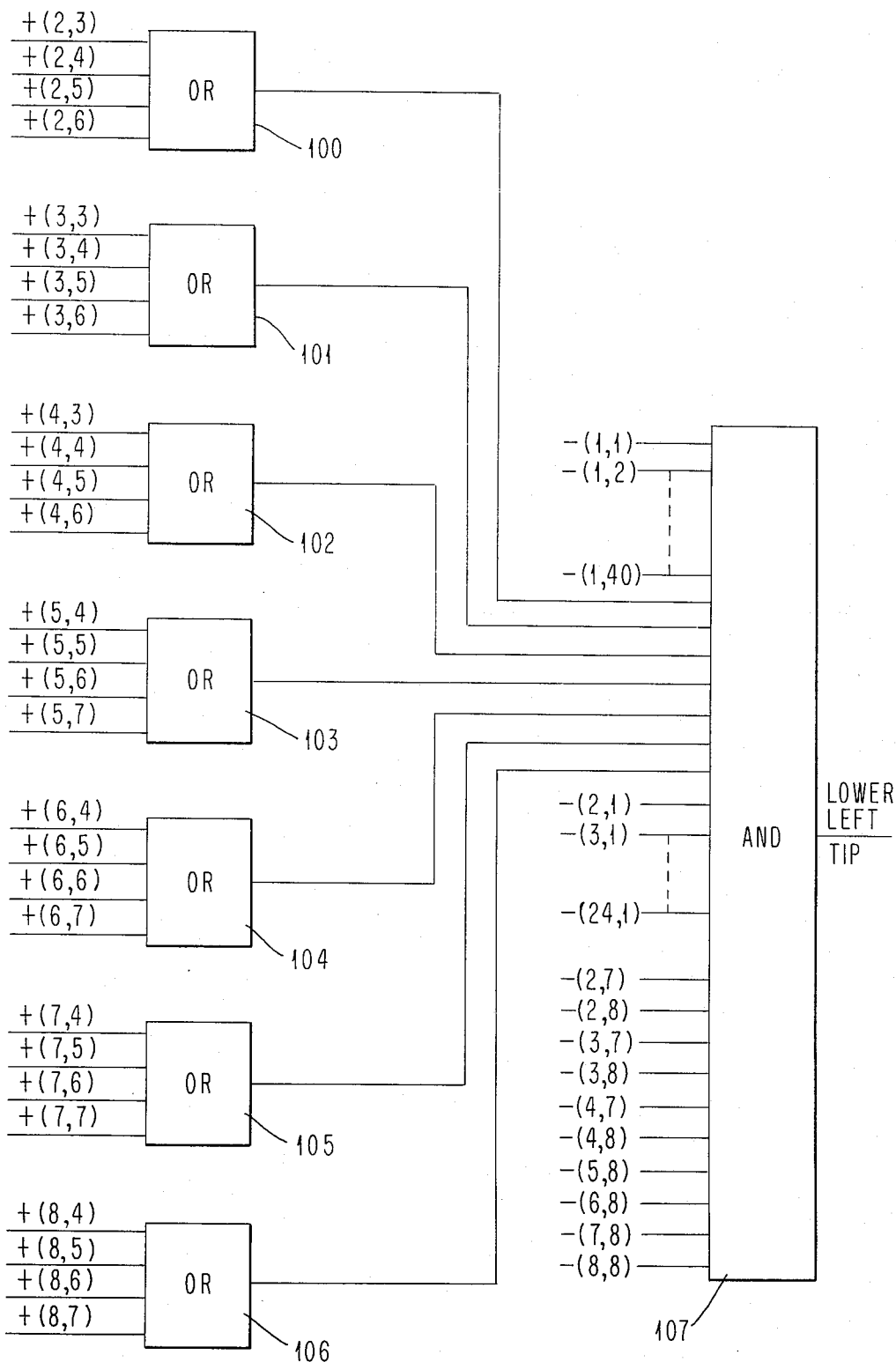
FIG. 7 shows a logic circuit representation for implementation of the criteria of FIG. 6.

FIG. 7 shows in logic format representation exactly what FIG. 6 has shown in a pictorial representation. In FIG. 7 the 7 OR circuits 100 through 106 are each shown with an appropriate four digit input. The plus sign in the representation shown in FIG. 7 indicates that the input must be in a one state condition for the OR circuit to be satisfied. Consequently, if any one of the four inputs is in a one state condition, the ORs will be satisfied and a raised output will be provided for the AND circuit 107. The circuit arrangement shows that all seven of the OR circuits must be satisfied before the AND circuit 107 will provide an output. Additionally, the appropriate zero state conditions must also be present before AND circuit 107 will provide its output. The presence of the minus sign next to the input coordinates indicates that that particular location must be in the zero state condition.

In FIGS. 2 through 5, the illustration of finding the long upper right tip reduced to a one level logic circuit shown in FIG. 5C. Note that the testing for the long lower left tip shown in FIG. 6 results in a two level logic circuit as shown in FIG. 7.

Figure 8A:
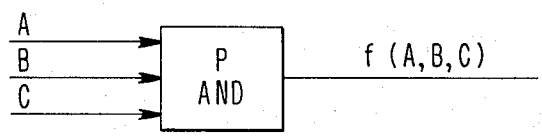
FIG. 8A is a representation of a programmable AND circuit.

Having now illustrated the use of the shift register with character recognition devices and having shown the nature of feature extraction, the principle of a programmable or associative array will now be discussed. Reference is made first to FIG. 8A which is a simple representation of a programmable AND circuit. The inputs are shown as A, B and C with the output a function of those three inputs. In the ordinary AND circuit the output would be present only if A, B and C were all present. In the programmable AND circuit the inputs can be programmed to be in the zero or the one state condition and in a "don't care" state as well. Thus the programmable AND circuit shown in FIG. 8A might be satisfied for a condition in which input A was zero, input B was one and input C was either one or the other.

Figure 8B:
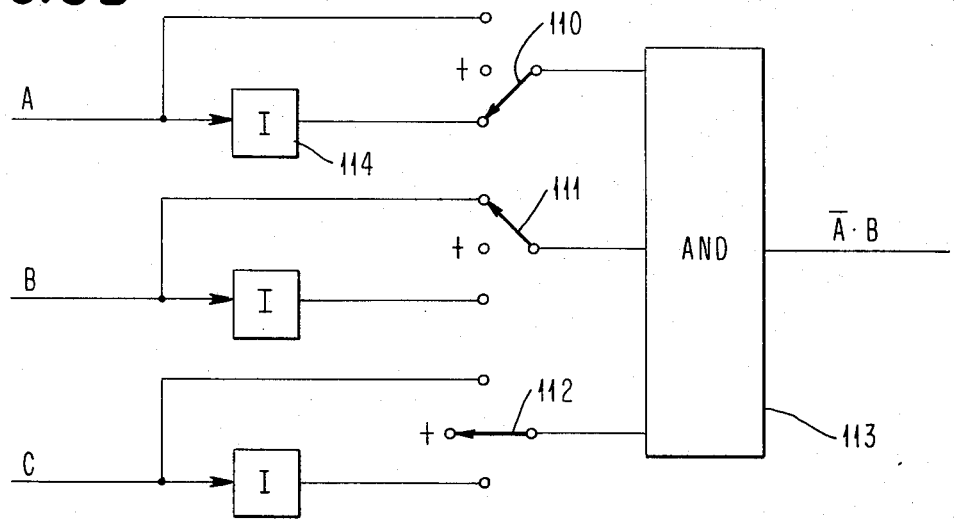
FIG. 8B is a circuit representation showing the functioning of a programmable AND circuit.

FIG. 8B shows a programmable AND circuit representation and how the functional output can be achieved. Note that if switch 110 is in the position shown a requisite one state condition to satisfy the AND circuit 113 will be present only if input A is zero. This is true because of the inverter 114. However, input B must be in the one state for AND circuit 113 to be satisfied because of the position of switch 111. Input C, on the other hand, could be in either a zero or a one state condition; it would make no difference because the position of the switch 112 is such as to always provide a one state condition input to the AND circuit 113. Thus the circuit 113 has been programmed by the switches 110, 111 and 112 to provide an output which is a function of not A and B.

Figure 8C:
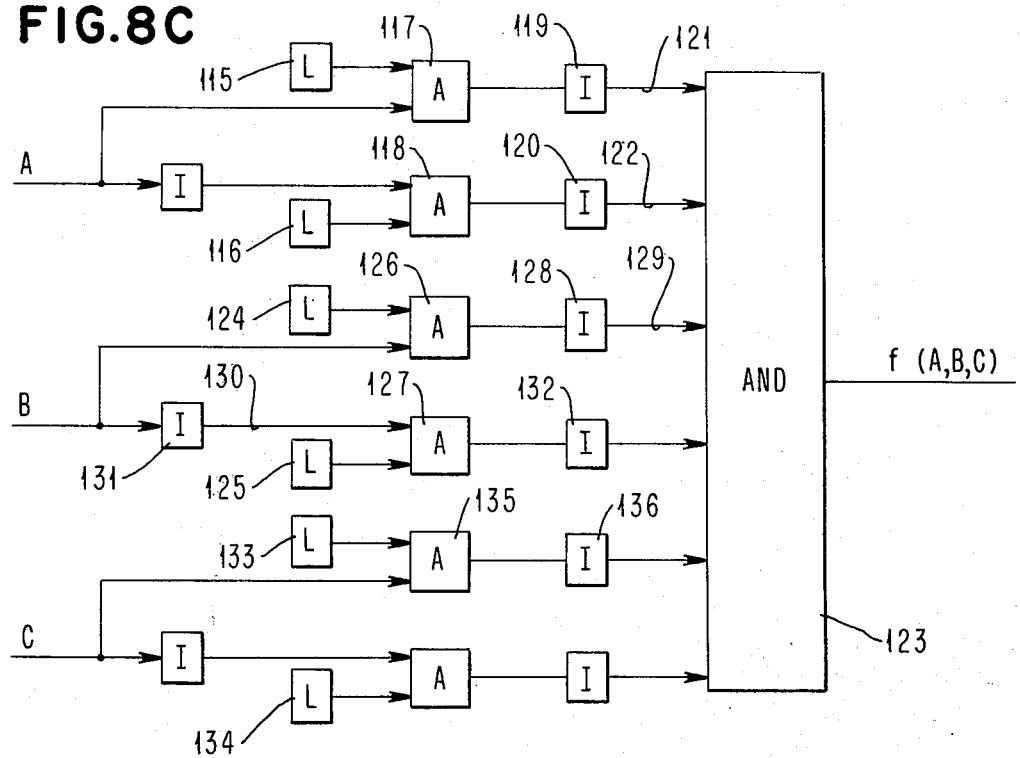
FIG. 8C is a third representation of a programmable AND circuit.

FIG. 8C is a circuit representation performing the function shown in FIG. 8B with the switches replaced by digital latches. With respect to input A FIG. 8C shows two latches 115 and 116. If both of these latches are set to zero the output of AND circuits 117 and 118 will be zero regardless of what the input A happens to be. With zero input to the inverter circuits 119 and 120 the result is a raised condition on both of the input lines 121 and 122 feeding the final AND circuit 123. Thus the two inputs to the final AND circuit 123 representing the condition of the input A are both raised regardless of the state of input A. With respect to input B, suppose the latch 124 is set to the zero state but latch 125 is in the one state. The result of such a latch arrangement is that the AND circuit 126 will not be satisfied, and, therefore, a zero input to the inverter 128 will produce a one state output along line 129 thus satisfying the final AND circuit 123. However, the one state condition of latch 125 provides a result that will satisfy AND circuit 127 only as long as line 130 is raised. Because of the presence of inverter 131, line 130 will be raised only if input B is zero. With input B zero, AND circuit 127 is satisfied, the operation of the inverter 132 produces a zero output resulting in the disabling of a positive output from the final AND circuit 123. Thus if we are to have an output from the final AND circuit, input B must be in the one state.

With respect to input C suppose that latch 133 is in the one state while latch 134 is in the zero state. If input C is one the result is a satisfied AND circuit 135 producing an output which is inverted by inverter 136 to the zero state which causes the disabling of a positive output from the final AND circuit 123. Thus if we are to have an output from the final AND circuit 123, input C must be zero.

With the switches in the condition as indicated above, there is provided a programmable AND circuit that produces an output only when input C is zero and input B is one. Input A can be in either the zero or the one state condition and it will not affect the production of an output from final AND circuit 123. One other possibility has not been covered and that is that both of the latches for a particular input are in the one state. Reflection will show that if such a condition is present a meaningless result is produced, since the final AND circuit could never be satisfied.

Thus in FIG. 8B there has been provided an AND circuit 123 the output of which is a function of the input A, B and C, and which is programmable to provide any combination of three state conditions for those inputs. The circuit of FIGS. 8A, B and C is known as a programmable logic array or associative array when placed in an array structure. Such an array provides a very large amount of logic capability in a small circuit area. Problems, however, in providing the necessary inputs to the array over a small number of input pins and deriving the necessary outputs from the array have reduced the importance of the technology in terms of actual application to commercial product. One of the basic inventive features herein is the combination of the programmable array with an input provided from a shift register thus solving many of the problems of data input. By multiplexing outputs from the programmable AND circuits, the invention herein also reduces the number of output pins necessary to handle the logic outputs. Also, referring back to FIG. 7, it was necessary to provide two levels of logic to perform that feature extraction. Consequently, if this array technology is to be applied to the feature extraction problem, it is necessary to obtain multiple levels of logic in the logic array.

DESCRIPTION OF EMBODIMENTS

Figure 9:
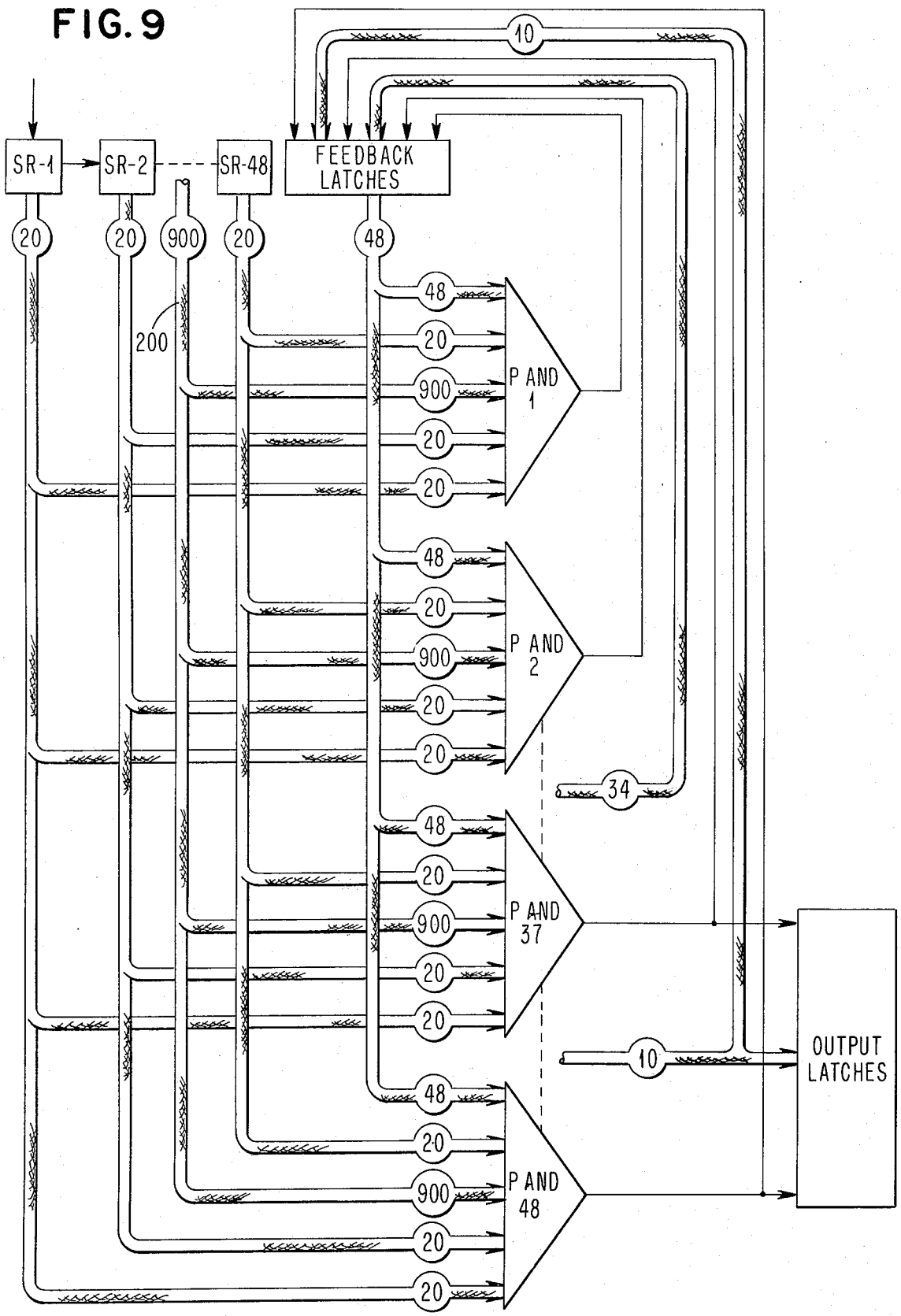
FIG. 9 is a representation of a circuit embodiment of the inventive system.

FIG. 9 is a particular implementation of the logic system of this invention showing the connection of programmable AND circuits with shift registers to provide the necessary ingredients for solving the feature extraction problem. While this system was invented for feature extraction, it will be obvious to a person skilled in the art that many other logic problems can be solved through this particular system or variations of it.

In the particular embodiment shown in FIG. 9, a 960 bit shift register has been provided to produce a data input for the logic array. The 960 bit shift register can be viewed as 48 serially connected shift registers each containing 20 bits. The significance of such a view of the shift register is to accommodate a particular monolithic implementation which happens to be 20 bits wide. Thus in FIG. 9 shift register one represents 20 input digits or bits or latches, shift register 2 contains 20 more input digits or bits and shift register 48 contains 20 input bits. The remaining 900 input bits from the other shift registers are shown being provided to the logic circuits over cable 200. Thus a 960 digit input is provided to programmable AND (PAND) circuit 1. To relate back, this corresponds to the three digit input being provided to the PAND circuit 123 in FIG. 8C, to the 28 inputs provided to the 7 OR circuits 100–106 in FIG. 7 and to the 14 inputs being provided to the AND circuit 10 in FIG. 5C. Remember, however, that to perform a feature extraction, FIG. 7 indicated the need for two levels of logic. To accommodate multiple levels of logic FIG. 9 shows a provision for feedback latches into which the output of the 48 PAND circuits is placed. Thus to perform the operation of FIG. 7, the initial 7 way OR each utilizing four inputs of the 960 possible inputs would involve seven of the 48 PAND circuits shown on FIG. 9. In this instance the PAND circuits would be operating as OR circuits. The output of these seven PAND circuits would be fed into the feedback latches and on a second cycle or phase the output of these 7 feedback latches would be fed into one of the 48 PAND circuits along with all of the 73 zero registration inputs necessary to satisfy the criteria of the feature extraction shown in FIG. 7. Should a further level of logic be necessary for any particular feature extraction, obviously the process can be repeated by passing the output of the second level of logic back to the feedback latches and from there into the next PAND operation. The process can be repeated for as many levels of logic as is necessary to obtain any particular feature extraction.

In FIG. 9 note that only 12 of the PAND circuits are connected to output latches. Consequently, it would make sense for the user of the system to utilize one of these twelve circuits for his final AND so that the output could be applied directly to the output latches. FIG. 9 also shows that the feedback latches enable the storing of results from all of the 48 PAND circuits so that when an appropriate time arrives the result may be fed through one of the 12 output lines. Consequently, the 48 feedback latches not only serve to provide a mechanism for the production of multiple levels of logic but also provide a mechanism for reducing the number of output pins necessary to service all of the logic array circuits.

In the above discussion, note that the programmable AND circuits were utilized to perform a logical OR function in order to perform the feature extraction shown in FIG. 7. The use of AND circuits to implement OR functions is well known to those skilled in the art; the Boolean expression for such a logical switch is known as DeMorgan's Rule. Essentially this rule states that an OR function of given inputs can be obtained by an inversion of the output of the inverted inputs ANDed together. With reference to FIG. 8B, suppose that all of the three switches 110, 111 and 112 are placed in the position shown for switch 110. That would produce an output from AND circuit 113 only when not A, not B and not C were present. By inverting the output of circuit 113 we would then have no output when the three inputs are all zero. However, if one of the inputs is in the one state, then the AND circuit 113 will produce no output and the result of an inversion of that output would be the one state condition. The same would be true if both inputs A and B were present or if all three of the inputs were present or if only B were present or if only C were present. Thus, the circuit of FIG. 8B has been turned into an OR circuit by simply inverting the output of the final AND 113 and the placing of the switches 110, 111 and 112 on the inverted input signal. In that manner, the programmable AND circuit may be converted to and used as an OR circuit, if desired.

Thus, the circuit of FIG. 9 provides a complete input, output and logic circuit system for performing feature extraction operations in a character recognition device. In a particular machine designed to test for unconstrained hand printing it might be necessary to have as many as 300 feature measurements in order to identify such characters. These measurements would be performed in the circuits shown in FIG. 9 one at a time and fed out into the twelve output latches. From there the results are fed into the decision processor as shown in FIG. 1. The decision processor would take the presence or not presence of a particular feature and after examining all 300 features, would then make a probabilistic determination as to whether the input character can be recognized as a particular value. Should experience with the device show that it is making incorrect determinations it is quite simple to modify the feature extraction system shown in FIG. 9. To change the criteria for feature extraction, all that is necessary is to set the latches differently for a given input and thus does not involve the changing of the hardwired circuit. Thus, the system of FIG. 9 meets the requirements of a changeable circuit without producing scrap and rework at either the design stage or in the field.

Figure 10:
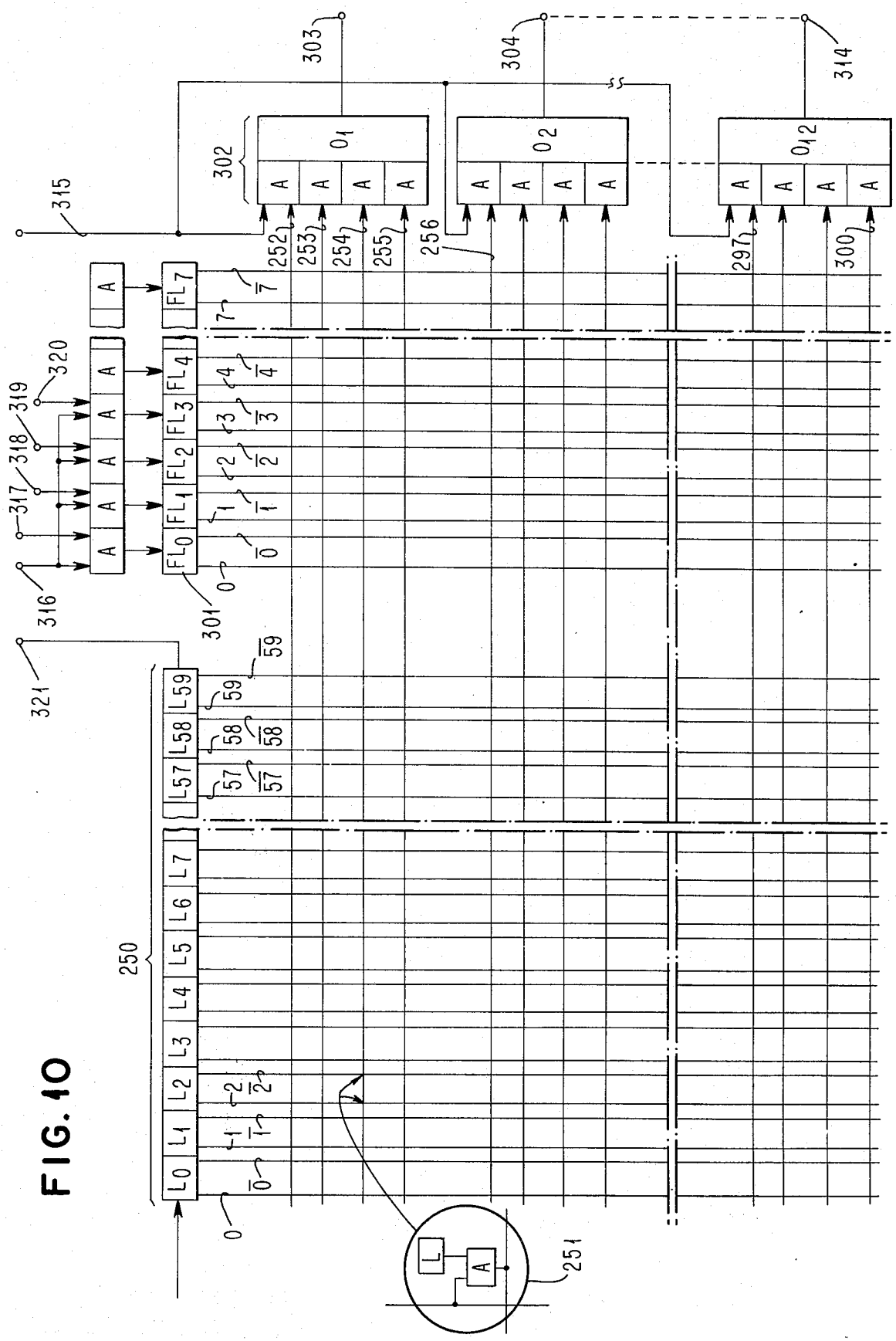
FIG. 10 shows a representation of an integrated circuit chip design for the inventive system.

As mentioned above both the programmable array and the shift register contain inherent regularity and hence are ideal organizations for use in LSI technology. To implement the system of FIG. 9 in LSI technology, integrated circuit chips such as shown in FIG. 10 can be produced. Note that only 60 bits of the 960 bit shift register are accommodated on a single chip as shown at 250. Simple arithmetic reveals that if 60 bits are accommodated on a single chip and 960 bits are to be used for the entire system, 16 chips are needed for providing the necessary input to implement the system of FIG. 9.

Note in FIG. 10 that two lines extend from each one of the input bits or latches. These lines indicate both the true and the complement form of the input and are indicated as 0,0 bar, 1,1 bar, 2,2 bar, etc., and thus the inputs to the 48 PAND circuits would be two times 960 rather than simply 960. The same result could have been achieved with one line had the inverting logic component shown in FIG. 8C been used with the circuit of FIG. 10. Instead, however, in FIG. 10 a simple AND with a latch provides the PAND function in the array as shown at 251.

Line 252 represents aa read line which contains the output of part of the first PAND circuit; it contains that part of the output derived from the 60 inputs on one chip. The production of the entire 960 bit array will be explained below.

To implement the system shown in FIG. 9, there are 48 PAND circuits on each chip as shown by read lines 252 through 300. Also, since there are 48 feedback latches which must be accommodated within the system and the feedback latches must be distributed over 16 chips, there must be three feedback latches per chip. Actually, however, eight feedback latches have been provided per chip as shown at 301. The reasons for the extra feedback latches will be explained below.

First, however, note that the chip is small in size and for space reasons there are a limited number of pins available for output circuits from the programmable array. FIG. 10 shows that the 48 output circuits are fed through twelve AND/OR circuits 302 in groups of four to twelve output pins 303 through 314. Therefore, in order to read the output of line 252 on terminal 303, a clocking signal is provided over line 315 through the AND/OR circuit 302. The clocking signal is simultaneously provided to connect the output of line 256 to pin 304 and similarly provides one output in each group of four outputs to each of the twelve output pins. The clocking signal on line 315 will henceforth be referred to as a phase one signal. FIG. 10 shows that line 253 will also be read from the output pin 303 and in order to provide the line 253 output at the proper time the phase one signal on line 315 is turned off and a phase two signal not shown in FIG. 10 would be clocked into AND/OR circuit 302 to provide the necessary connection for line 253 to the output pin 303. Similarly, a phase three signal, also not shown, provides a connection for line 254 to output pin 303 and a phase four signal, not shown, provides a connection for line 255 to the output pin 303. Since all 48 outputs are provided in groups of four to the twelve output pins, the four phase signals clock out all of the 48 circuits in four groups of twelve to the twelve output pins.

The circuit of FIG. 9 shows that the 48 outputs are fed back to feedback latches. The circuit shown on the chip in FIG. 10 has eight feedback latches per chip. Since there are 48 feedbacks and 16 chips, 3 of the logic circuit outputs must be fed back through feedback latches on each chip. However, since we have four phase times to provide the twelve outputs, the output of four PAND logic circuits are provided successively on output pin 303. If output pin 303 is tied to pin 316, then each of these four signals will appear at pin 316 at successive points in time. If the phase one signal is placed on pin 317, output line 252 will then be gated through pin 303, through pin 317, and hence to feedback latch $FL_0$. At phase time two, line 253 will be gated through output pin 303 to pin 316 and if the phase two signal is provided on pin 318, it is gated into $FL_1$. In that manner four, instead of three, of the PAND circuit outputs may be easily gated to the feedback latches on one chip.

Figure 11:
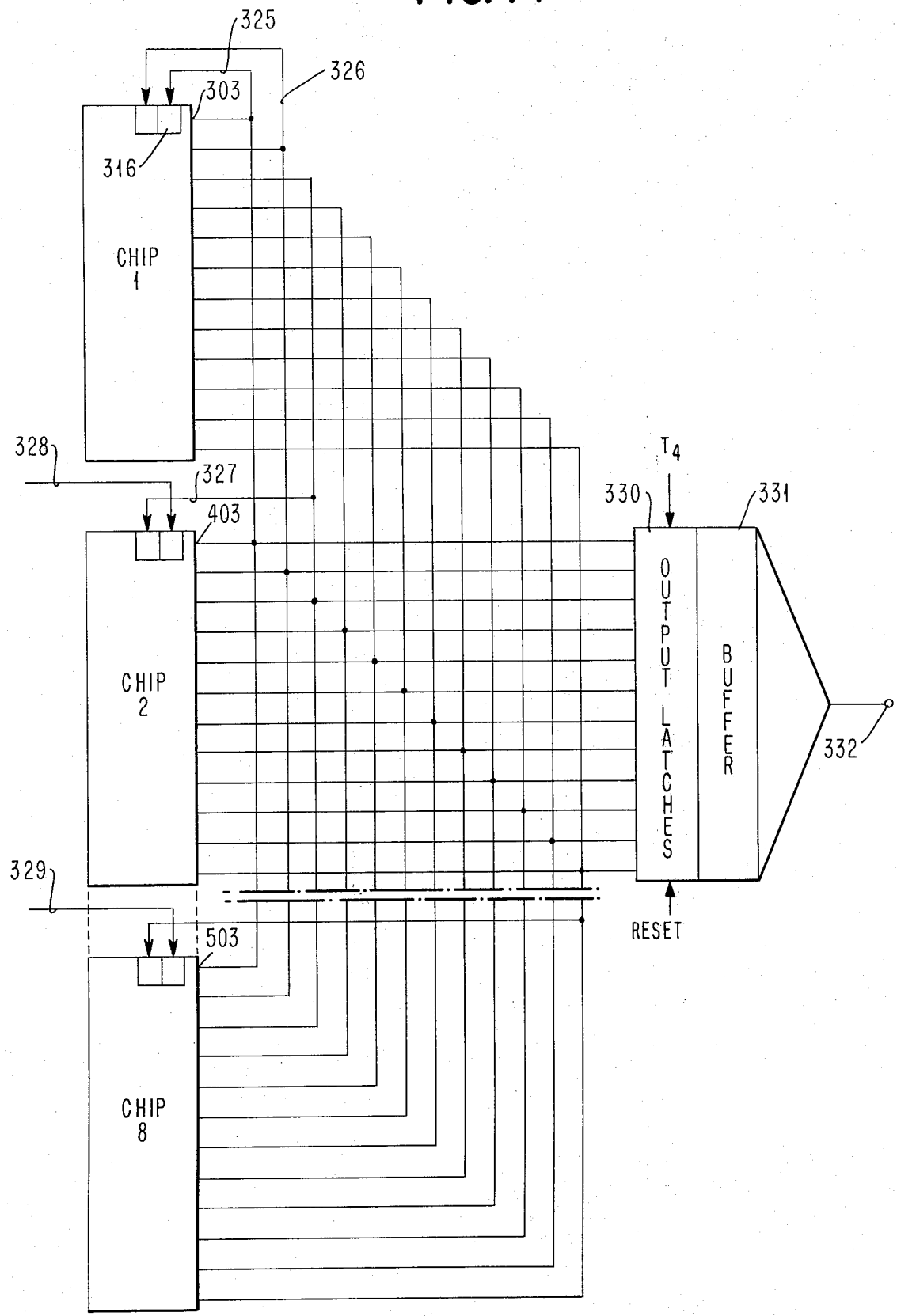
FIG. 11 illustrates the interconnection of chip outputs.

Terminal 321 provides means for connecting the 60 bit shift register on the chip in FIG. 10 to the next chip in order to provide the serial shifting of the Figure throughout the 960 bit register. Note, however, that with the PAND circuits 252 through 300 reading only 60 of the 960 inputs, provision must be made for incorporating the inputs of the successive chips in order to provide the entire 960 inputs into each of the 48 PAND outputs. That is accomplished through the chip interconnection arrangement diagram shown on FIG. 11. FIG. 11 calls for only eight chips rather than 16 chips. Explanation will be provided below as to how the number of chips in an interconnected set may be reduced in half. Now, however, it should be noted that each of the eight chips produces 12 outputs. One of these 12 outputs from each chip is dot ORed into a single interconnection line. Thus, the output at terminal 303 is dot ORed onto line 325, the output on terminal 403 on chip 2 is dot ORed on line 325, and the output from terminal 503 on chip 8 is also dot ORed on the same output interconnection line. Similarly, one output from each of the remaining chips, not shown, is connected into line 325. Line 325 is then connected to the terminal 316 on chip 1 providing the feedback to the latches on that chip. In this manner all 960 inputs are logically available to the array for setting the feedback latch at 316. Note in FIG. 11 that line 326 provides for feedback of an additional four PAND circuits into the feedback latches of chip 1. Thus chip 1 would necessarily need eight feedback latches in order to accommodate all eight of the PAND feedbacks. However, chip 2 accommodates only four PAND circuits over line 327 to its feedback registers. There are consequently four feedback latches on chip 2 which are not utilized by a PAND circuit internal to the chips. Consequently, line 328 is provided to set those four extra feedback latches with information from an external source. Similarly, line 349 on chip 8 is provided for external source usage. The result of having eight feedback latches on eight chips is to provide 64 feedback latches, 48 of which are used for internal feedback leaving 16 latches for external use.

Each of the 12 output pins are connected to the output latches 330. The information in these latches in turn is transferred to the buffer 331 and read out in serial fashion over terminal 332 to the decision processor.

At this point it is necessary to explain how the circuit is provided through the use of only eight chips instead of sixteen chips. For that explanation, reference should be made to FIG. 12 where the 48 shift registers of twenty bits each are shown in a manner similar to that provided in FIG. 9. Note, however, that every other register of twenty bits is excluded from connection to the logic array. The excluded positions of the shift registers are referred to as "dummy" positions and the connected positions as "active" positions. As a result in FIG. 12 only 480 inputs are provided to the 48 PAND circuits. By reducing the number of input lines to the array, in half, the size of the 48 logic circuits are reduced practically in half. As a consequence each chip may contain 120 shift registers rather than 60. In that manner 960 bit positions may be accommodated in eight chips rather than 16.

While the above is true it should be obvious that all 960 positions should be active simultaneously to provide the feature extraction expected. Therefore, provision must be made for viewing the dummy positions. In order to do that, an extra 20 position shift register is provided on the input to the circuit. When that external 20 bit shift register is not in use, the information in shift register 1, 3, etc. will contain the expected portion of the field. However, when the external 20 bit shaft register is in use shift register 1 will contain the information found in shifting register 2 when the external shift register is not in use. Hence, provision is made for the same connection to read all of the 960 bit scanning areas with half the number of interconnection lines.

Figure 14:
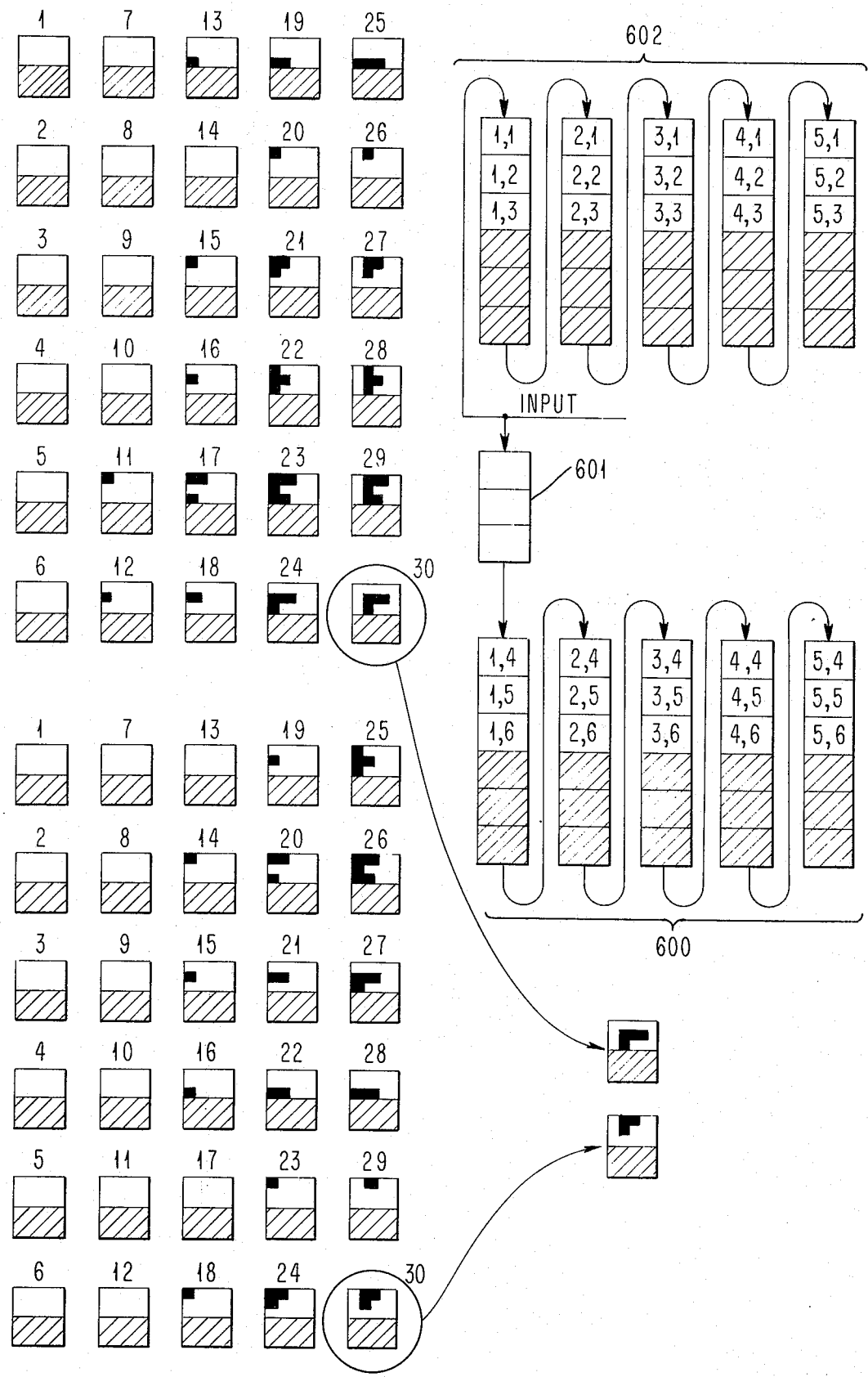
FIG. 14 is a circuit representation showing the use of multi-level logic.

The concept may be more easily understood with reference to FIG. 14 which is a 30 position scan of the letter F much the same as was previously provided in FIG. 4. In FIG. 14, however, the dummy positions are indicated by the shaded portion in the 30 position array and in the shaded portion of the shift register. Note that during the first ten cycles the active positions are totally blank which is the same situation as was present with respect to FIG. 4. The character F first appears in Frame 11. FIG. 14 shows that two 30 position shift registers are used in conjunction with the 30 position scan instead of just the one 30 position shift register previously needed. Note, however, that shift register 600 receives its input through a 3 position shift register 601. The effect after six cycles would cause shift register 602 to contain information in frames 4, 5 and 6 in the active portion (1,1), (1,2) and (1,3), while the information in frames 1, 2 and 3 would be in the active portions of shift register 600 at locations (1,4), (1,5) and (1,6). After 30 cycles the information contained in the active positions in shift register 602 is the top half of the scanned area and the information in the active positions of shift register 600 is the bottom half of the scanned area. Thus by connecting a logic array to both of the two shift registers the complete picture of the input can be obtained.

Figure 12:
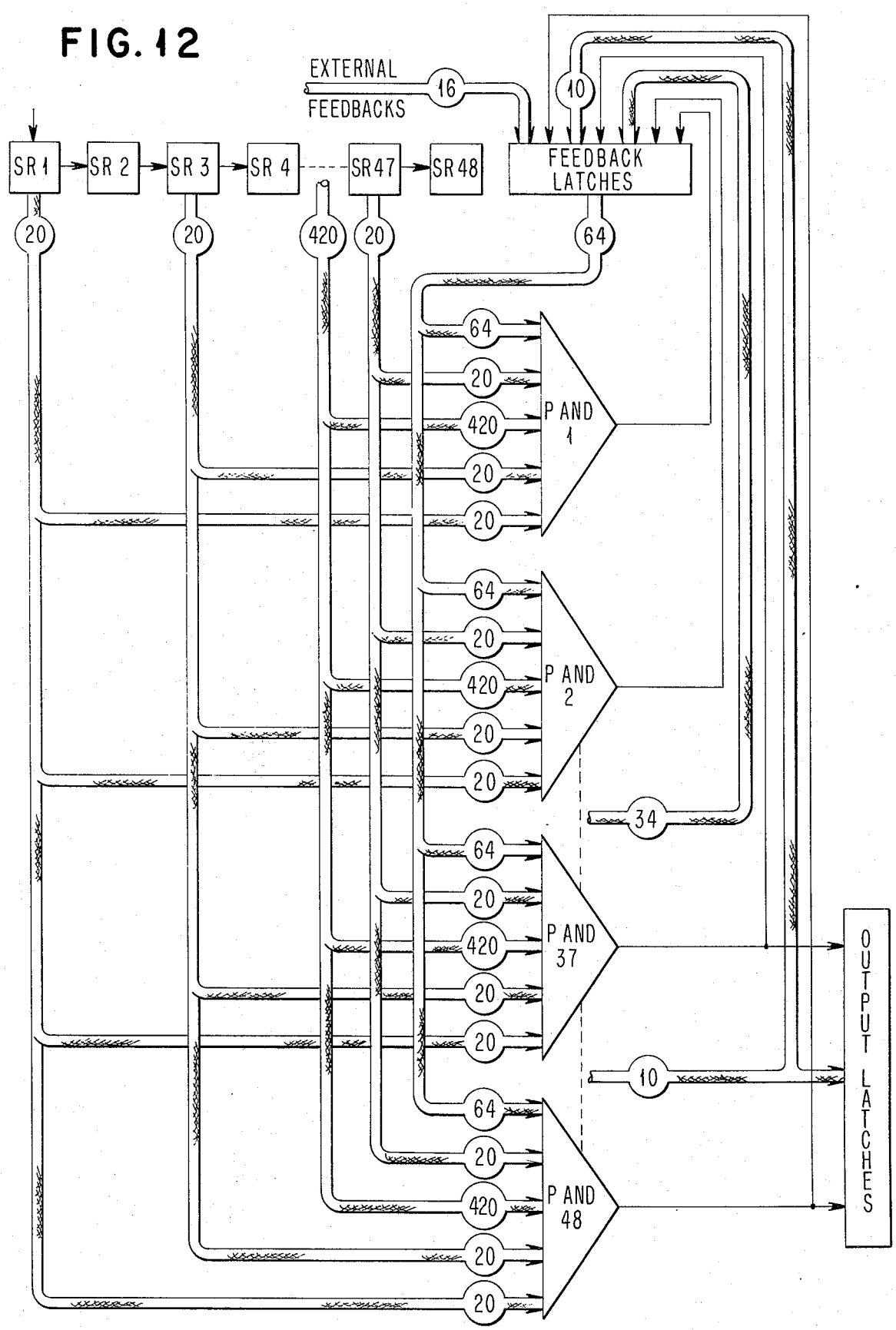
FIG. 12 shows a 30 position scan with "dummy" positions in the input data shift register.

It should now be clear that it still takes sixteen chips to produce the entire picture of the character in the circuit of FIGS. 12. However, by utilizing the dummy shift registers, the number of inputs in each PAND circuit is reduced in half. Were that not done, it would be impossible in present day technology to place all 48 of the PAND circuits on a single chip. Hence, the use of the dummy shift registers enables a much greater logic compacting on the silicon than would otherwise be possible. Also since many feature measurements are ordinarily connected entirely in the top half or entirely in the bottom half of a character, all the needed inputs are provided in one set of eight chips. For those cases where some of the inputs must be taken from the top half and some from the bottom half the provision of feedback latches enables the output information from the top half circuit to be placed into feedback latches in the bottom half or vice versa. In such a manner, the entire feature inspection may be made.

Figure 15:
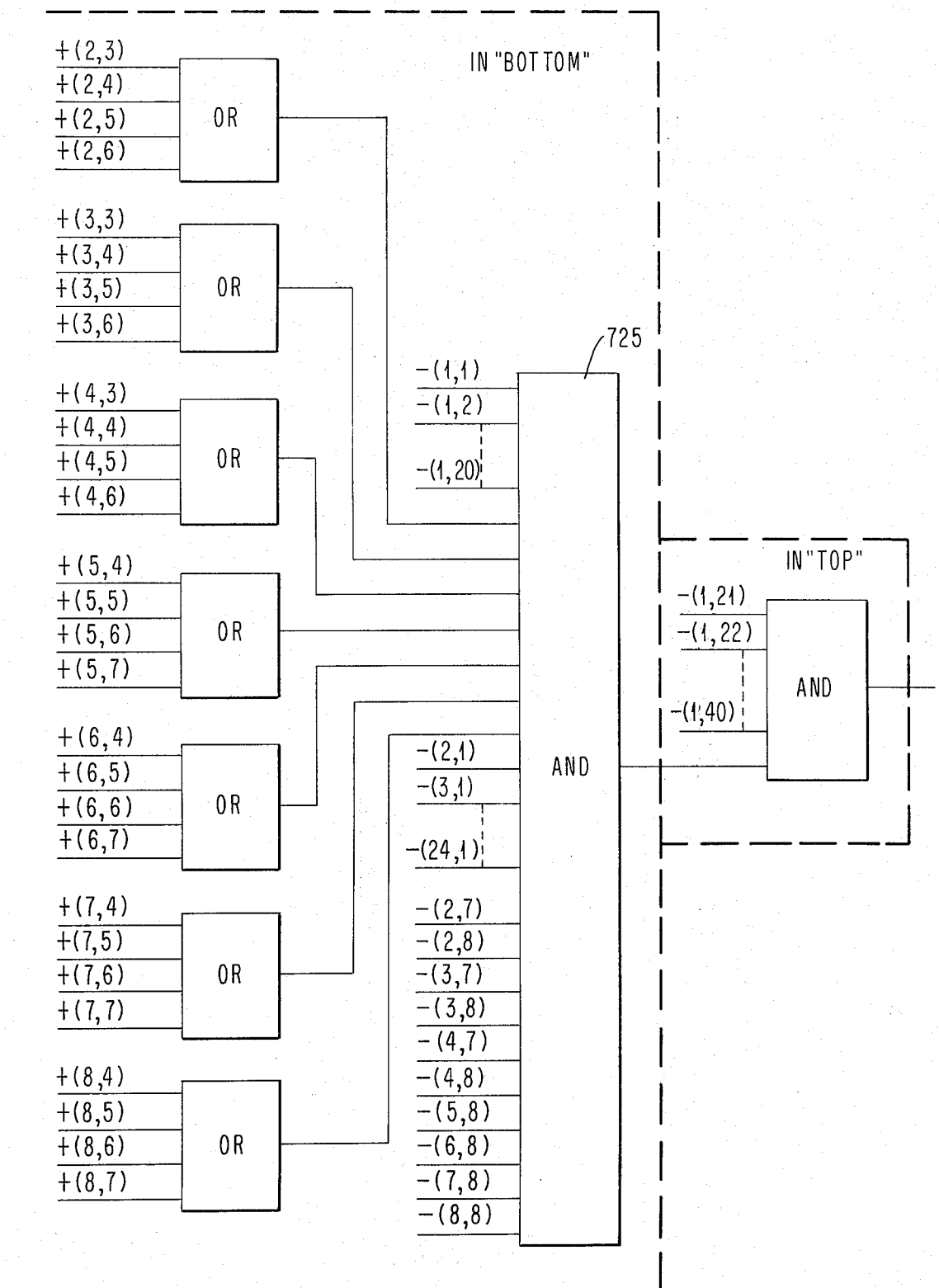
FIG. 15 is a representation of circuit modifications to the basic inventive system.

To example a measurement which is made in both the top and the bottom half, refer to FIG. 15 which shows the same feature measurement made on FIG. 7. Remember that in FIG. 7 the feature for which the criteria was designed was a lower left tip. Since all of the positive inputs for the 7 OR circuits are found in the bottom half, the particular array on a group of chips which inspects the bottom half contains all the needed inputs. That information is stored in 7 feedback latches within that measurement element (set of 8 chips) and on a second phase are fed into a final AND circuit 725 along with all of the zero state information available in the bottom half. The output of circuit 725 is then fed out over an external feedback connection to a measurement element containing information from the top half of the scan. Thus, the feature extraction measurement which was made in two logic levels in FIG. 7 is made in three logic levels in FIG. 15 because of the use of the dummy shift registers and by virtue of the external feedback feature.

In the example of FIG. 15, two logic levels were used in the bottom half and fed to the top half for a third logic level. Suppose a different measurement that required the number of logic levels in the bottom half to total four. In this instance, the top half would not receive the necessary input from the bottom half until after a data shift had been made — since a data shift cycle occurs every four phases. Consequently, provision would have to be made in the top half to compensate for the shifted data in order to correctly make the final logical operation on the next phase 1 cycle. Suppose, however, that the following logical operation needed the final result commencing with phase 1. In this instance, the first logical operation in the bottom half could be performed in phase 4 of the data shift cycle preceding the bottom operation. In that manner, the bottom half logical operations would complete on phase 3 and the top half final logical operation could be completed on phase 4 and be available on phase 1 of the next data shift cycle. Compensation for the position of the data would be needed on the initial bottom logical operation.

Figure 13:
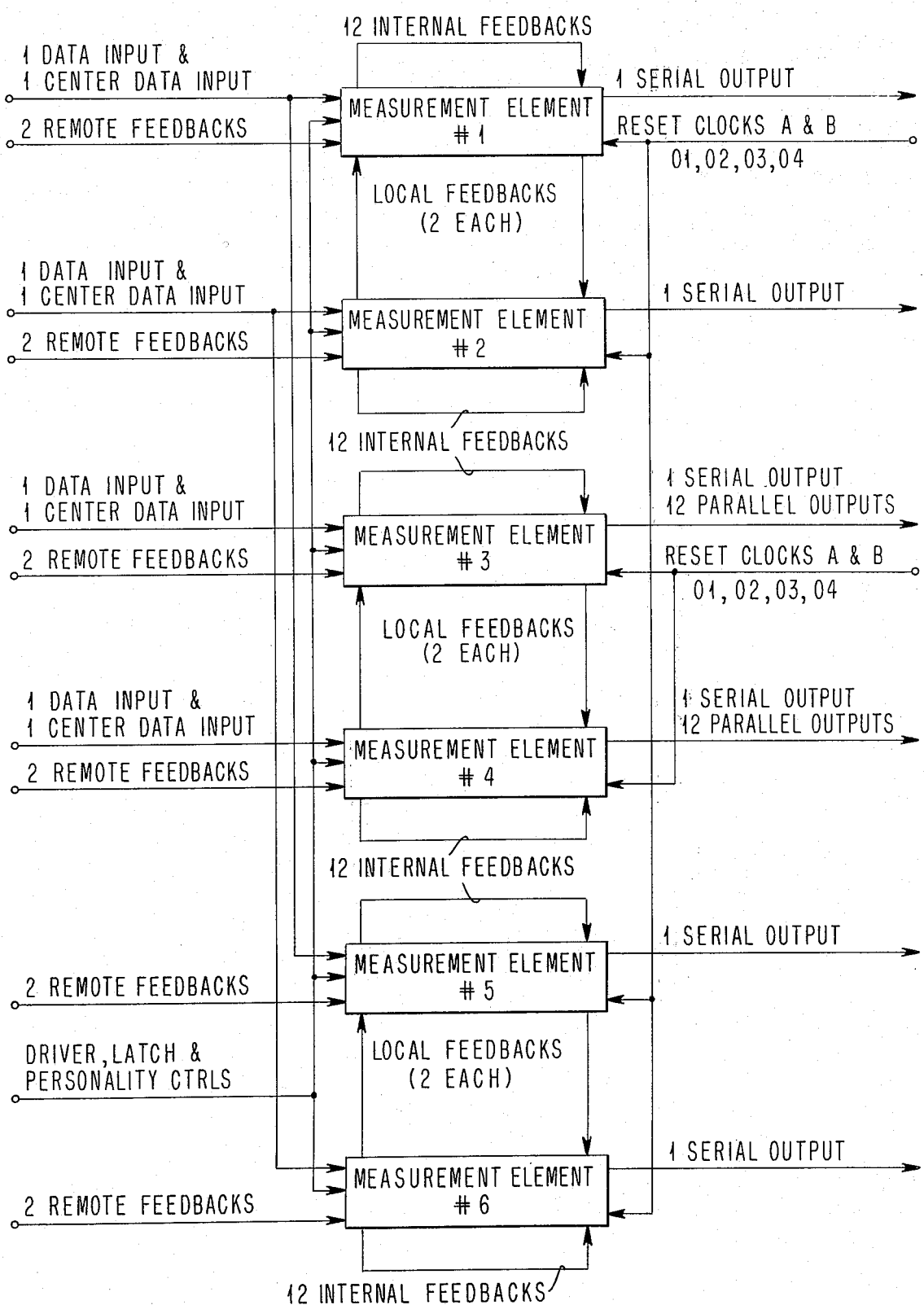
FIG. 13 illustrates the layout of the measurement card containing all of the measurement elements necessary to perform the feature extraction function in a particular character recognition machine.

Reference should now be made to FIG. 13 where a complete feature extraction card is laid out. Measurement number one contains eight chips with 48 PAND circuits fed by 480 inputs (plus 64 feedbacks). Measurement element one is connected to inspect the top half of a 960 bit scan and measurement element number two is paired with element number one to inspect the bottom half of the same 960 bit scan. Each of the measurement elements contain twelve internal feedbacks as shown on the chip interconnection diagram FIG. 11. Since each of these twelve internal feedback lines are multiplexed to carry 48 feedback signals they represent the use of 48 feedback latches on the eight measurement chips. Eight more feedback latches are used by local feedback from the paired measurement element. Thus, there are eight feedback latches in measurement element number one which receive a local feedback from measurement element number two. Two local feedback lines are shown on FIG. 13 but since four outputs are multiplexed on each line it represents the use of eight feedback latches. Eight more feedback latches in each measurement element are utilized to contain remote feedback from an external source which might be another pair of measurement elements or information from completely off the measurement card. The total of 48 latches used for the internal feedback, eight latches for the local feedback and eight latches for the remote feedback totals the 64 latches available on the eight chip measurement element.

Figure 16:
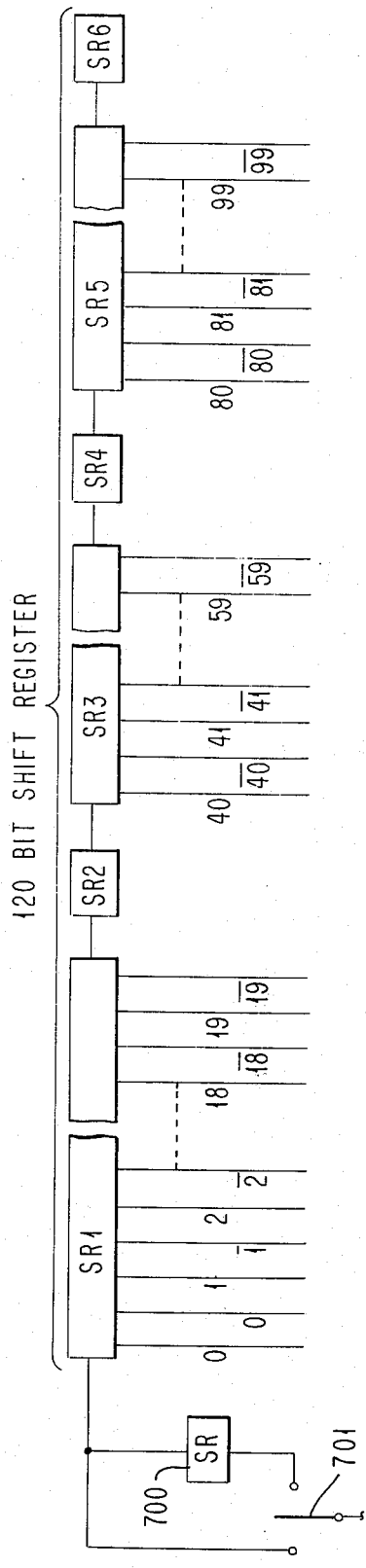
FIG. 16 is a representation of further circuit modifications to the inventive system for restricting the detection operation to the significant one-half of a character frame representation.

FIG. 16 shows the 120 bit shift register that is located on a single chip utilizing the top and bottom approach to the feature extraction. External shift register 700 is utilized to provide bottom half information to the active portions of the 120 bit shift register by positioning switch 701 to provide data input through shift register 700. On the other hand, the active portions of the 120 bit shift register contains top half information if switch 701 is connected to provide the data input bypassing shift register 700.

Figure 17:
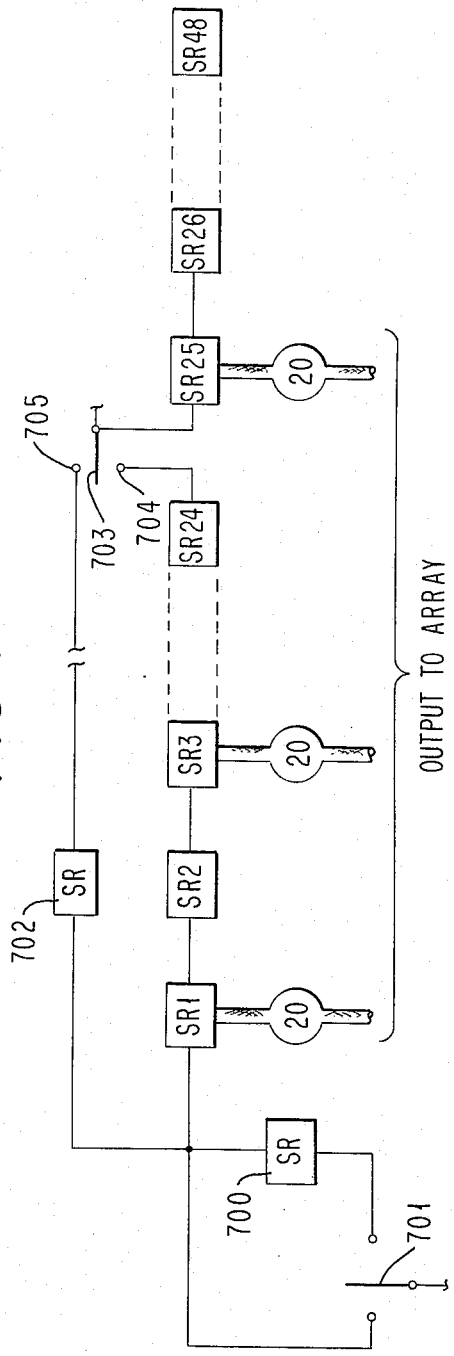
FIG. 17 shows a representation of a modification which restricts the detection operation to the significant quarter of a character frame.

FIG. 17 shows a mechanism through which the top and bottom half feature extraction can be expected into a left side and right side feature extraction. Suppose switch 701 is positioned such as to bypass shift register 700. Suppose further that switch 703 is positioned in contact with terminal 704. Such an arrangement of the switches provides a circuit containing the top half of a figure as previously described. However, if switch 703 is positioned in contact with terminal 705 and if shift register 702 is 20 bits in size, the effect is to place the information contained in the dummy registers 2, 4, 6, etc. into registers 25, 27, 29 etc. Thus, after 480 cycles the entire top and bottom half of the right side of a figure will be contained in that portion of the shift register which is connected to the logic array. Thus, it can be seen that by the use of the shift register 702 and the switch 703 an inspection may be made of the right side of the array. By continuing to shift the figure another 480 cycles an inspection can be made of the left side of the array. Thus, if a feature is known to be only on the right side or the left side of an array, a provision of shift register 702 and switch 703 makes possible some saving in the use of the logic array. Also, it effectively redimensions an array from 480 by 48 to 960 by 24.

Referring again to FIG. 13 note that the remote feedbacks on the card enable communication between elements outside the measurement element pair and make possible communication between elements on different cards. These connection points provide a mechanism for making a measurement which extends beyond the 960 by 48 array. For example, if the array needed to contain all necessary measurement data were larger than could be contained in a 960 bit scan, the information from one measurement pair can be fed to the second measurement pair in order to accomplish a larger geometry.

FIG. 11 shows a serialization of the outputs on terminal 332 from the measurement element while FIG. 13 shows that for measurement elements 3 and 4 all twelve of the outputs are brought to output pins. In a feature extraction operation one serial output is all that is needed since the decision processor will inspect for one feature at a time. The provision of the twelve parallel outputs on measurement elements 3 and 4 is merely to provide versatility in the use of the measurement card should the logic capability contained therein be utilized for another function such as, for example, in the decision processor. FIG. 13 also shows the input lines for phase clocks and an output latch and array personality control input. The latter, of course, is necessary to provide the logic array with the settings it needs to inspect for a particular feature.

Thus a system has been provided combining shift registers and associative memories in the feature extraction portion of a character recognition device. Circuits have been arranged to provide feedback latches affording the capability of multilevel logic in the logic array. Outputs of the array have been multiplexed in order to minimize the number of output pins necessary to accommodate the entire logic function. Inputs to the array have been minimized by the unique use of shift registers on the input and by dummy registers within the shift register circuit in order to maximize the logic capability of a given area of silicon.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A fabrication arrangement for use in a measurement element that detects characteristics of an input bit stream, the measurement element comprised of a plurality of LSI chips, each chip including
   a portion of a shift register for the measurement element,
   an input pin on the chip connected to an input of the shift register portion,
   a programmable logic array (PLA) section, a set of inputs of the PLA section selectively connected to outputs of the portion of the shift register on the chip, and the PLA section having a plurality of outputs, the input bit stream being supplied to the PLA section from the shift register portion for bit stream detection operations,
   a plurality of latches on the chip,
   coupling means for connecting outputs of said latches to other inputs of the PLA section,
   a plurality of latch input pins,
   means for respectively connecting the latch input pins to inputs of the latches,
   time multiplexing means for selectively connecting groups of PLA outputs of the PLA section to array output pins of the same chip, each group being connected to a different array output pin, the number of array output pins being substantially less than the number of PLA outputs,
   a plurality of clocking pins, and
   gating means for connecting inputs of the latches to the clocking pins, and the number of latches being at least equal to the number of PLA outputs in each group.

2. The fabrication arrangement of claim 1, in which the programmable logic array section on each chip is arranged in the form of input columns and output rows, each chip further including
   a plurality of control gates respectively associated with each cross-over of an input column and an output row of the array section,
   an input of each control gate connected to the associated input column of the array section,
   an output of each control gate connected to an output of the associated row of the array section,
   a plurality of bistable circuits respectively associated with the control gates, each bistable circuit having an output respectively connected to another input of the associated control gate,
   whereby the electrical states of the bistable circuits control the type of detection operations performable by the fabrication arrangement.

3. The fabrication arrangement of claim 2, in which each chip further includes
   a plurality of multiplexing gates, each multiplexing gate having an input connected to the output of a respective row in the array section,
   a plurality of common connecting means, each common connecting means having inputs connected to outputs of a group of multiplexing gates, outputs of the common connecting means respectively connected to array output pins on the chip, and
   a plurality of clocking pins on the chip respectively connected to inputs of different multiplexing gates in each group,
   whereby the number of pins on each chip is substantially less than the number of outputs of the array section.

4. A fabrication arrangement for a measurement system including a first plurality of LSI chips, in which each chip comprises
   a portion of a shift register formed on the chip,
   an input pin on the chip connected to an input of the shift register portion,
   a programmable logic array (PLA) section formed on each chips the PLA section being arranged in input columns and output rows,
   a plurality of control gates respectively associated with each cross-over of an input column and an output row in the PLA section,
   an input of each control gate connected to the associated input column of the PLA section,
   an output of each control gate connected to an output of the associated row of the PLA section,
   a plurality of bistable circuits having outputs respectively connected to other inputs of the control gates, whereby the states of the bistable circuits control the detection operations performable by the measurement system,
   a set of inputs of the PLA section selectively connected to outputs of the shift register portion on the same chip, means connecting outputs of the PLA section to output pins on the chip,
   a plurality of latches also fabricated on each chip,
   connecting means on each chip for connecting outputs of said latches to other inputs of the PLA section on the same chip, and
   a plurality of latch input pins, and
   means for respectively connecting the latch input pins to inputs of the latches;
   a plurality of measurement elements in the measurement system, each measurement element comprising,
   a second plurality of the chips which is a subset of the first plurality of chips,
   interconnecting means external to the second plurality of chips for connecting corresponding output pins on the second plurality of chips predetermined latch input pins of selected chips in the second plurality of chips,
   the measurement system cmprising
   a plurality of measurement elements, and
   measurement output signal means being connected to selected interconnecting means of the measurement elements to provide the detected outputs of the measurement system, whereby a plurality of detection operations are provided as outputs of the measurement system by the measurement output signal means.

5. The fabrication arrangement of claim 4, in which each chip further includes
- a plurality of multiplexing gates respectively having inputs connected to the outputs rows in each array section,
- a plurality of common connecting means, each common connecting means having inputs connected to outputs of a group of multiplexing gates, outputs of the common connecting means respectively connected to array output pins on the chip, and
- a plurality of output clocking pins on the chip, each output clocking pin respectively connected to inputs of the multiplexing gates in each of the groups on the chip.

6. The fabrication arrangement of claim 5, in which each chip further comprises
- another plurality of latch clocking gating means for connecting latch clocking pins and at least one latch input pin to the inputs of feedback latches on each chip, the number of feedback latches being equal to the number of multiplexing gates in each group,
- the feedback latches being a subset of the plurality of latches fabricated on the chip, each feedback latch receiving a feedback signal from one of the interconnecting means of the measurement unit.

7. A fabrication arrangement for a measurement system having chips as defined in claim 6, in which each measurement element further comprises
- a combined logic array comprised of the combination of all array sections on the plurality of chips in the measurement element and the plurality of interconnecting means external to the chips, wherein each interconnecting means connects together corresponding array output pins on the chips, and wherein each interconnecting means connects to the latch clocking pin on a different chip of the measurement element, a measurement-element input shift register formed of all the shift register portions on the chips,
- a clocking means providing clock cycles comprising a sequence of clock pulses between shifts of the input shift register, clock cycle distributing means connecting the plurality of clock pulses separately to the output clocking pins on each chip in the measurement element to control the combined logic array outputs of the respective interconnecting means, the clock cycle distribution means also connecting the plurality of clock pulses respectively to the latch clocking pins on each chip in the measurement element,
- whereby each interconnecting means in the combined array is enabled by a different one of the clock pulses in each clock cycle to provide a respective feedback signal to one of the feedback latches on one of the chips in the measurement element to obtain a signal logic operation of the combined array, so that during each clock cycle the number of sequential logic operations for the combined array is determined by the number of multiplexing gates on a single chip, and whereby each single logic operation provides a feedback input which can be used by a subsequent logic operation from different multiplexing gates during a subsequent clock pulse.

* * * * *